United States Patent
Jae et al.

(12)

(10) Patent No.: US 12,234,555 B2
(45) Date of Patent: Feb. 25, 2025

(54) SUBSTRATE TREATING APPARATUS AND FILLER MEMBER PROVIDED THEREIN

(71) Applicant: SEMES CO., LTD., Cheonan-si (KR)

(72) Inventors: Jin Mo Jae, Asan-si (KR); Seung Hoon Oh, Cheonan-si (KR); Young Seop Choi, Cheonan-si (KR); Mi So Park, Daejeon (KR); Jong Hyeon Woo, Asan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 664 days.

(21) Appl. No.: 17/503,741

(22) Filed: Oct. 18, 2021

(65) Prior Publication Data
US 2022/0186379 A1 Jun. 16, 2022

(30) Foreign Application Priority Data
Dec. 10, 2020 (KR) ........................ 10-2020-0172077

(51) Int. Cl.
*C23C 18/16* (2006.01)
*H01L 21/67* (2006.01)
*H01L 21/687* (2006.01)

(52) U.S. Cl.
CPC ...... *C23C 18/1685* (2013.01); *C23C 18/1619* (2013.01); *H01L 21/67034* (2013.01);
(Continued)

(58) Field of Classification Search
CPC ......... H01L 21/67051; H01L 21/67034; H01L 21/67103; H01L 21/6719; H01L 21/68785; C23C 18/1685; C23C 18/1619
See application file for complete search history.

(56) References Cited

U.S. PATENT DOCUMENTS

| | | | |
|---|---|---|---|
| 6,312,518 B1 * | 11/2001 | Kwon | G03F 7/168 118/69 |
| 7,513,265 B2 * | 4/2009 | Yoshikawa | H01L 21/67017 134/33 |

(Continued)

FOREIGN PATENT DOCUMENTS

| | | | |
|---|---|---|---|
| CN | 102687242 A | 9/2012 | |
| JP | 2013033962 A * | 2/2013 | ............. F26B 25/14 |

(Continued)

OTHER PUBLICATIONS

Machine translation of JP-2013033962 to Chang, Feb. 2013. (Year: 2013).*

(Continued)

*Primary Examiner* — Benjamin L Osterhout
(74) *Attorney, Agent, or Firm* — Harness, Dickey & Pierce, P.L.C.

(57) ABSTRACT

An apparatus for treating a substrate includes a vessel having a sealable process space formed therein in which the substrate is accommodated, a supply port that is provided inside a wall of the vessel and that supplies a process fluid into the process space, an exhaust port provided inside the wall of the vessel and spaced apart from the supply port, and a buffer member provided in the process space, the buffer member being provided in a position overlapping with the supply port and the exhaust port when viewed from above. The buffer member includes a sidewall portion that is located outward of the supply port and the exhaust port and that makes contact with the wall of the vessel and an upper wall portion having a through-hole formed therein to correspond to a center of the substrate, the through-hole forming a straight flow path in an up/down direction.

20 Claims, 10 Drawing Sheets

(52) U.S. Cl.
CPC .. *H01L 21/67051* (2013.01); *H01L 21/67103* (2013.01); *H01L 21/6719* (2013.01); *H01L 21/68785* (2013.01)

(56) References Cited

U.S. PATENT DOCUMENTS

| | | | |
|---|---|---|---|
| 2010/0147396 A1 | 6/2010 | Yamagishi et al. | |
| 2015/0155188 A1* | 6/2015 | Jung | H01L 21/67051 34/558 |
| 2017/0345680 A1 | 11/2017 | Lee et al. | |
| 2018/0190485 A1* | 7/2018 | Jang | H01L 21/67103 |
| 2018/0337076 A1 | 11/2018 | Nishide et al. | |
| 2018/0358242 A1* | 12/2018 | Kim | H01L 21/67126 |
| 2019/0164787 A1* | 5/2019 | Lee | H01L 21/6715 |

FOREIGN PATENT DOCUMENTS

| | | |
|---|---|---|
| JP | 2013-120944 A | 6/2013 |
| JP | 2014-175669 A | 9/2014 |
| JP | 2018-207103 A | 12/2018 |
| KR | 10-2014-0017315 A | 2/2014 |
| KR | 10-2018-0077949 A | 7/2018 |
| KR | 10-2018-0079264 A | 7/2018 |
| KR | 102037844 B1 | 11/2019 |
| KR | 102075675 B1 | 3/2020 |
| TW | 201306157 A | 2/2013 |
| TW | 201533830 A | 9/2015 |
| TW | 201637087 A | 10/2016 |
| TW | 201707132 A | 2/2017 |
| TW | 201832305 A | 9/2018 |
| WO | WO-2013/108750 A1 | 7/2013 |

OTHER PUBLICATIONS

Taiwanese Office Action dated Jul. 11, 2022 issued in corresponding Taiwanese Appln. No. 11120684620.
Korean Office Action dated Oct. 31, 2022 issued in corresponding Korean Appln. No. 10-2020-0172077.
Japanese Office Action dated Dec. 27, 2022 issued in corresponding Japanese Appln. No. 2021-200448.
Korean Office Action, dated Jul. 19, 2023, issued in corresponding Korean Patent Application No. 10-2020-0172077.

* cited by examiner

SUBSTRATE TREATING APPARATUS AND FILLER MEMBER PROVIDED THEREIN

CROSS-REFERENCE TO RELATED APPLICATIONS

A claim for priority under 35 U.S.C. § 119 is made to Korean Patent Application No. 10-2020-0172077 filed on Dec. 10, 2020, in the Korean Intellectual Property Office, the entire contents of which are hereby incorporated by reference.

BACKGROUND

Embodiments of the inventive concept described herein relate to a substrate treating apparatus and a filler member provided therein.

In general, semiconductor elements are manufactured from a substrate such as a wafer. Specifically, the semiconductor elements are manufactured by forming micro circuit patterns on the upper surface of the substrate through a deposition process, a photolithography process, an etching process, and the like. During the processes, foreign matter may be generated on the upper surface of the substrate on which the circuit patterns are formed, and a cleaning process for removing the foreign matter may be performed.

Nowadays, a supercritical fluid is used in a cleaning process or a developing process. For example, the upper surface of a substrate may be wet with a leaning prevention liquid such as isopropyl alcohol (IPA), and thereafter the leaning prevention liquid remaining on the substrate may be removed by supplying supercritical carbon dioxide ($CO_2$) to the upper surface of the substrate.

A vessel having a process space in which a process fluid is able to be maintained in a supercritical state at high temperature and high pressure is used in a process using a supercritical fluid. When a substrate is treated with the process fluid (e.g., carbon dioxide) in the supercritical state, the process space of the vessel has to maintain the process fluid above its critical temperature and critical pressure. To maintain the pressure in the process space above the critical pressure, the process fluid has to be supplied into the process space. In this process, temperature distribution for each area of the substrate may not be uniform due to a flow of the process fluid supplied at a temperature different from the temperature in the process space.

SUMMARY

Embodiments of the inventive concept provide a substrate treating apparatus for efficiently treating a substrate.

Embodiments of the inventive concept provide a substrate treating apparatus for making temperature distribution for each area of a substrate uniform even by a flow of a process fluid supplied into a process space.

Embodiments of the inventive concept provide a substrate treating apparatus for a uniform flow of a process fluid supplied into a process space and directed toward a substrate.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a vessel having a sealable process space formed therein in which the substrate is accommodated, a supply port that is provided inside a wall of the vessel and that supplies a process fluid into the process space, an exhaust port provided inside the wall of the vessel and spaced apart from the supply port, and a buffer member provided in the process space, the buffer member being provided in a position overlapping with the supply port and the exhaust port when viewed from above. The buffer member includes a sidewall portion that is located outward of the supply port and the exhaust port and that makes contact with the wall of the vessel and an upper wall portion having a through-hole formed therein to correspond to a center of the substrate, the through-hole forming a straight flow path in an up/down direction.

In an embodiment, the through-hole may be aligned with the exhaust port.

In an embodiment, the supply port, when viewed from above, may be provided at a position where the through-hole of the upper wall portion is not formed.

In an embodiment, the flow path formed by the through-hole may have a length greater than or equal to 30% of a total height of the buffer member and less than the total height of the buffer member.

In an embodiment, the buffer member may further include an inner wall portion extending downward from the upper wall portion to increase a length of the flow path of the through-hole, and a buffer space may be formed by the sidewall portion, the upper wall portion, and the inner wall portion.

In an embodiment, the apparatus may further include a plate member located over the buffer member and provided in a position overlapping the through-hole when viewed from above, the plate member being spaced apart from the buffer member.

In an embodiment, the plate member may include an upper surface, a lower surface, and a side surface, the upper surface may have a larger area than the lower surface and may be disposed side by side with the lower surface to face the lower surface, and the side surface may connect the upper surface and the lower surface and may be formed to be upwardly inclined toward the top.

In an embodiment, a first bottom surface that defines the process space may be formed in the vessel. A recess may be formed to a predetermined depth on the first bottom surface, and a second bottom surface may be formed by the recess. The supply port and the exhaust port may be provided in an area of the second bottom surface.

In an embodiment, the buffer member may be placed on the second bottom surface, and an upper surface of the buffer member placed on the second bottom surface may be in a position parallel to the first bottom surface.

In an embodiment, the buffer member may have a circular shape when viewed from above.

In an embodiment, the process fluid may be heated to a temperature higher than room temperature and may be supplied into the process space.

In an embodiment, the process fluid may be a supercritical fluid.

According to an embodiment, a filler member for filling part of a volume of a process space in a substrate treating apparatus including a vessel that provides the sealed process space, a supply port that supplies a process fluid into the process space, and an exhaust port that evacuates an atmosphere in the process space includes a plate member that is disposed under a substrate and that has a predetermined thickness and a buffer member provided under the plate member and spaced apart from the plate member. The buffer member includes a sidewall portion that is located outward of the supply port and the exhaust port and that makes contact with a wall of the vessel and an upper wall portion having a through-hole formed therein to correspond to a center of the plate member, the through-hole forming a straight flow path in an up/down direction.

In an embodiment, the through-hole may be aligned with the exhaust port.

In an embodiment, when viewed from above, the through-hole of the upper wall portion may be provided at a position not overlapping the supply port.

In an embodiment, the flow path formed by the through-hole may have a length greater than or equal to 30% of a total height of the buffer member and less than the total height of the buffer member.

In an embodiment, the buffer member may further include an inner wall portion extending downward from the upper wall portion to increase a length of the flow path of the through-hole, and a buffer space may be formed by the sidewall portion, the upper wall portion, and the inner wall portion.

In an embodiment, the plate member may include an upper surface, a lower surface, and a side surface, the upper surface may have a larger area than the lower surface and may be disposed side by side with the lower surface to face the lower surface, and the side surface may connect the upper surface and the lower surface and may be formed to be upwardly inclined toward the top.

In an embodiment, the buffer member may have a circular shape when viewed from above, and the plate member may have a circular shape when viewed from above.

According to an embodiment, an apparatus for treating a substrate includes a vessel having a sealable process space formed therein in which the substrate is accommodated, a supply port that is provided inside a wall of the vessel and that supplies a process fluid into the process space, an exhaust port provided inside the wall of the vessel and spaced apart from the supply port, and a filler member that fills part of a volume of the process space. A first bottom surface that defines the process space is formed in the vessel. A cylindrical recess is formed to a predetermined depth on the first bottom surface, and a second bottom surface is defined by the recess. The supply port and the exhaust port are provided in an area of the second bottom surface. The filler member includes a plate member that is disposed under the substrate and that has a predetermined thickness and a buffer member provided under the plate member and spaced apart from the plate member, the buffer member being provided in a position overlapping with the supply port and the exhaust port when viewed from above. The buffer member includes a sidewall portion that is placed on the second bottom surface and located outward of the supply port and the exhaust port and that makes contact with the wall of the vessel, an upper wall portion having a through-hole formed therein to correspond to a center of the substrate, the through-hole forming a straight flow path in an up/down direction, and an upper surface of the upper wall portion being provided in a position parallel to the first bottom surface, and an inner wall portion extending downward from the upper wall portion to increase a length of the flow path of the through-hole.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
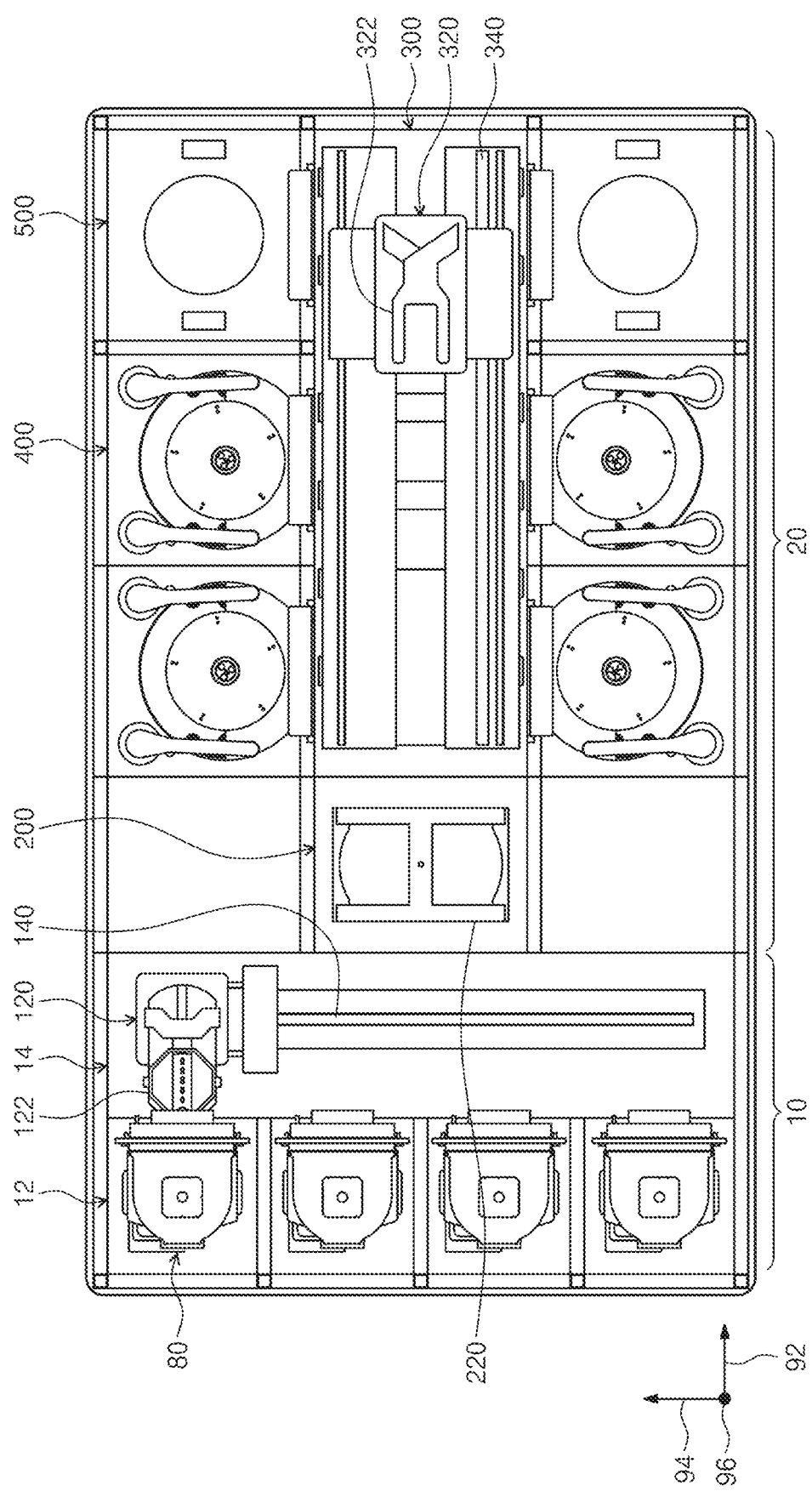
FIG. 1 is a schematic plan view illustrating a substrate treating system according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

The term "and/or" includes each mentioned item and every combination of mentioned items. When a component is described as "connected" to another component, this may mean that the components are not only directly "connected" but also are indirectly "connected" via a third component.

The inventive concept may be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

FIG. 1 is a schematic plan view illustrating a substrate treating system according to an embodiment of the inventive concept.

Referring to FIG. 1, the substrate treating system includes an index module 10, a process module 20, and a controller 30. According to an embodiment, the index module 10 and the process module 20 are disposed in one direction. Hereinafter, a direction in which the index module 10 and the process module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from a carrier 80, in which the substrates W are received, to the process module 20 and places, in the carrier 80, the substrates W completely treated in the process module 20. The index module 10 is disposed such that the lengthwise direction thereof is parallel to the second direction 94. The index module 10 has a load port 12 and an index frame 14. The load port 12 is located on the opposite side to the process module 20 with respect to the index frame 14. The carrier 80 having the substrates W received therein is placed on the load port 12. A plurality of load ports 12 may be provided. The plurality of load ports 12 may be disposed along the second direction 94.

An airtight carrier such as a front open unified pod (FOUP) may be used as the carrier 80. The carrier 80 may be placed on the load port 12 by a transfer unit (not illustrated), such as an overhead transfer, an overhead conveyor, or an automatic guided vehicle, or by an operator.

An index robot 120 is provided in the index frame 14. A guide rail 140, the lengthwise direction of which is parallel to the second direction 14, is provided in the index frame 14. The index robot 120 is movable on the guide rail 140. The index robot 120 includes a hand 122 on which a substrate W is placed. The hand 122 is movable forward and backward, rotatable about an axis facing the third direction 96, and movable along the third direction 96. A plurality of hands 122 may be provided. The plurality of hands 122 may be spaced apart from each other in an up/down direction and may independently move forward and backward.

The process module 20 includes a buffer unit 200, a transfer apparatus 300, liquid treatment apparatuses 400, and supercritical processing apparatuses 500. The buffer unit 200 provides a space in which the substrates W carried into the process module 20 and the substrates W to be carried out of the process module 20 temporarily stay. Each of the liquid treatment apparatuses 400 performs a liquid treatment process of treating a substrate W by dispensing a liquid onto the substrate W. Each of the supercritical processing apparatuses 500 performs a drying process of removing the liquid remaining on the substrate W. The transfer apparatus 300 transfers the substrates W between the buffer unit 200, the liquid treatment apparatuses 400, and the supercritical processing apparatuses 500.

The transfer apparatus 300 may be disposed such that the lengthwise direction thereof is parallel to the first direction 92. The buffer unit 200 may be disposed between the index module 10 and the transfer apparatus 300. The liquid treatment apparatuses 400 and the supercritical processing apparatuses 500 may be disposed on opposite sides of the transfer apparatus 300. The liquid treatment apparatuses 400 and the transfer apparatus 300 may be disposed along the second direction 94. The supercritical processing apparatuses 500 and the transfer apparatus 300 may be disposed along the second direction 94. The buffer unit 200 may be located at one end of the transfer apparatus 300.

According to an embodiment, the liquid treatment apparatuses 400 may be disposed on the opposite sides of the transfer apparatus 300. The supercritical processing apparatuses 500 may be disposed on the opposite sides of the transfer apparatus 300. The liquid treatment apparatuses 400 may be disposed closer to the buffer unit 200 than the supercritical processing apparatuses 500. On one side of the transfer apparatus 300, the liquid treatment apparatuses 400 may be provided in an A×B array (A and B being natural numbers of 1 or larger) along the first direction 92 and the third direction 96. Furthermore, on the one side of the transfer apparatus 300, the supercritical processing apparatuses 500 may be provided in a C×D array (C and D being natural numbers of 1 or larger) along the first direction 92 and the third direction 96. Alternatively, only the liquid treatment apparatuses 400 may be provided on the one side of the transfer apparatus 300, and only the supercritical processing apparatuses 500 may be provided on the opposite side of the transfer apparatus 300.

The transfer apparatus 300 has a transfer robot 320. A guide rail 340, the lengthwise direction of which is parallel to the first direction 92, may be provided in the transfer apparatus 300, and the transfer robot 320 is movable on the guide rail 340. The transfer robot 320 includes a hand 322 on which a substrate W is placed. The hand 322 is movable forward and backward, rotatable about an axis facing the third direction 96, and movable along the third direction 96. A plurality of hands 322 may be provided. The plurality of hands 322 may be spaced apart from each other in the up/down direction and may independently move forward and backward.

The buffer unit 200 includes a plurality of buffers 220 in which the substrates W are placed. The buffers 220 may be spaced apart from each other along the third direction 96. A front face and a rear face of the buffer unit 200 are open. The front face is a face that faces the index module 10, and the rear face is a face that faces the transfer apparatus 300. The index robot 120 may access the buffer unit 200 through the front face, and the transfer robot 320 may access the buffer unit 200 through the rear face.

Figure 2:
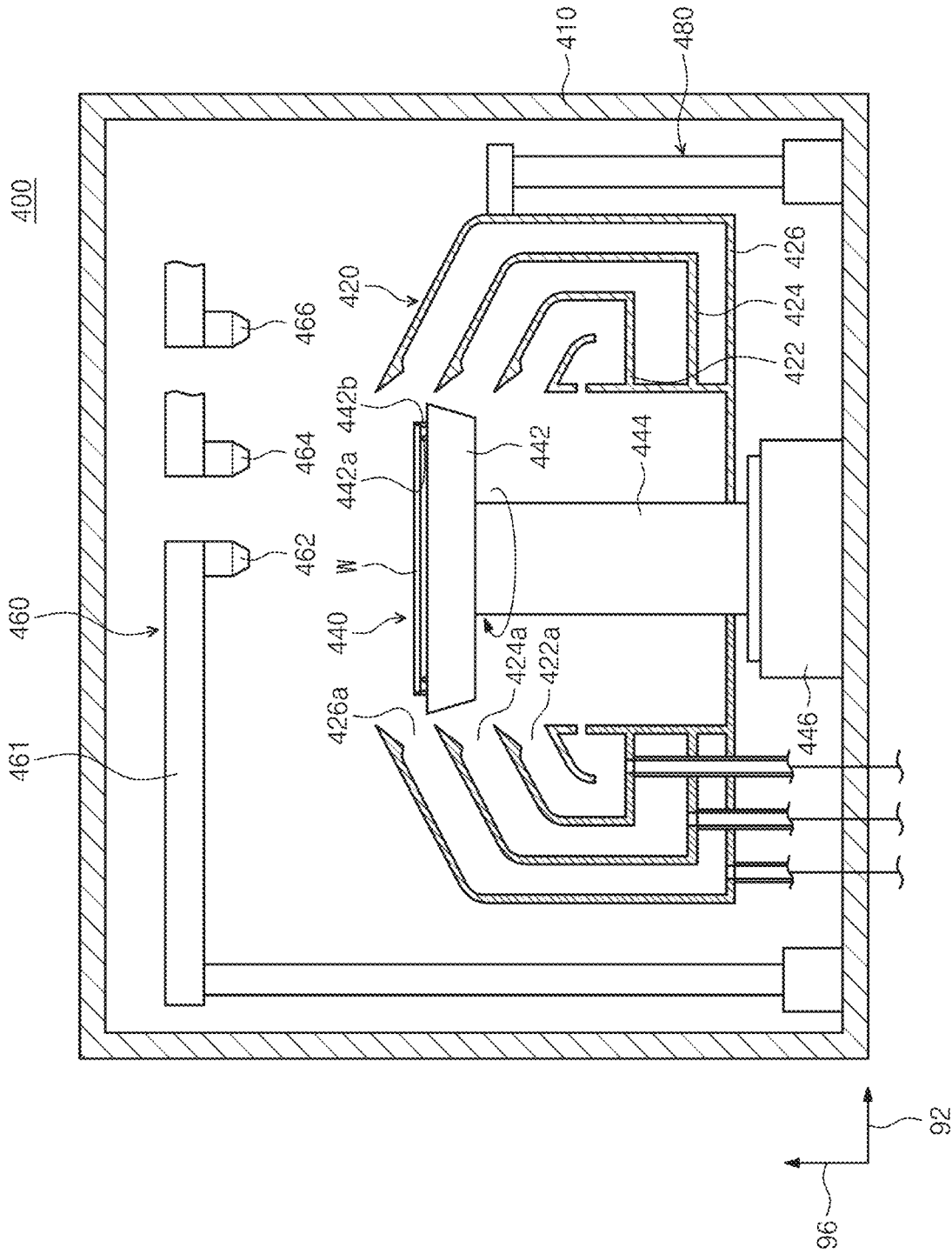
FIG. 2 is a schematic view illustrating one embodiment of a liquid treatment apparatus provided in the substrate treating system according to the embodiment of the inventive concept.

FIG. 2 is a schematic view illustrating one embodiment of the liquid treatment apparatuses 400 of FIG. 1. Referring to FIG. 2, the liquid treatment apparatus 400 has a housing 410, a cup 420, a support unit 440, a liquid dispensing unit 460, and a lifting unit 480. The housing 410 has a substantially rectangular parallelepiped shape. The cup 420, the support unit 440, and the liquid dispensing unit 460 are disposed in the housing 410.

The cup 420 has a process space that is open at the top, and a substrate W is treated with liquids in the process space. The support unit 440 supports the substrate W in the process space. The liquid dispensing unit 460 dispenses the liquids onto the substrate W supported on the support unit 440. The liquids may include a plurality of types of liquids and may be sequentially dispensed onto the substrate W. The lifting unit 480 adjusts the relative height between the cup 420 and the support unit 440.

According to an embodiment, the cup 420 has a plurality of recovery bowls 422, 424, and 426. The recovery bowls 422, 424, and 426 have recovery spaces for recovering the liquids used to treat the substrate W. The recovery bowls 422, 424, and 426 have a ring shape surrounding the support unit 440. The treatment liquids scattered by rotation of the substrate W during a liquid treatment process are introduced into the recovery spaces through inlets 422a, 424a, and 426a of the recovery bowls 422, 424, and 426. According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a drive shaft 444. The upper surface of the support plate 442 may have a substantially circular shape and may have a larger diameter than the substrate W. Support pins 442a are provided on a central portion of the support plate 442 to support the lower surface of the substrate W. The support pins 442a protrude upward from the support plate 442 to space the substrate W apart from the support plate 442 by a predetermined distance. Chuck pins 442b are provided on an edge portion of the support plate 442. The chuck pins 442b protrude upward from the support plate 442 and support a lateral portion of the substrate W to prevent the substrate W from deviating from the support unit 440 when the substrate W is rotated. The drive shaft 444 is driven by an actuator 446. The drive shaft 444 is connected to the center of the lower surface of the support plate 442 and rotates the support plate 442 about the central axis thereof.

According to an embodiment, the liquid dispensing unit 460 has a first nozzle 462, a second nozzle 464, and a third nozzle 466. The first nozzle 462 dispenses a first liquid onto the substrate W. The first liquid may be a liquid for removing a film or foreign matter remaining on the substrate W. The second nozzle 464 dispenses a second liquid onto the substrate W. The second liquid may be a liquid that dissolves well in a third liquid. For example, the second liquid may be a liquid that dissolves better in the third liquid than the first liquid. The second liquid may be a liquid for neutralizing the first liquid dispensed onto the substrate W. Furthermore, the second liquid may be a liquid that neutralizes the first liquid and that dissolves better in the third liquid than the first liquid. According to an embodiment, the second liquid may be water. The third nozzle 466 dispenses the third liquid onto the substrate W. The third liquid may be a liquid that dissolves well in a supercritical fluid used in the supercritical processing apparatuses 500. For example, the third liquid may be a liquid that dissolves better in the supercritical fluid used in the supercritical processing apparatuses 500 than the second liquid. According to an embodiment, the third liquid may be an organic solvent. The organic solvent may be isopropyl alcohol (IPA). Furthermore, the organic solvent includes ethylglycol, 1-propanol, tetra hydraulic franc, 4-hydroxyl, 4-methyl, 2-pantanone, 1-butanol, 2-butanol, methanol, ethanol, n-propyl alcohol, dimethylether, or the like, in addition to the isopropyl alcohol. According to an embodiment, the supercritical fluid may be carbon dioxide. The first nozzle 462, the second nozzle 464, and the third nozzle 466 may be supported on different arms 461. The arms 461 may be independently moved. Selectively, the first nozzle 462, the second nozzle 464, and the third nozzle 466 may be mounted on the same arm and may be simultaneously moved.

The lifting unit 480 moves the cup 420 in the up/down direction. The height of the cup 420 relative to the substrate W is changed by the movement of the cup 420 in the up/down direction. Accordingly, the recovery bowls 422, 424, and 426 for recovering the treatment liquids may be changed depending on the types of liquids dispensed onto the substrate W, and thus the liquids may be separately recovered. Alternatively, the cup 420 may be fixed, and the lifting unit 480 may move the support unit 440 in the up/down direction.

Figure 3:
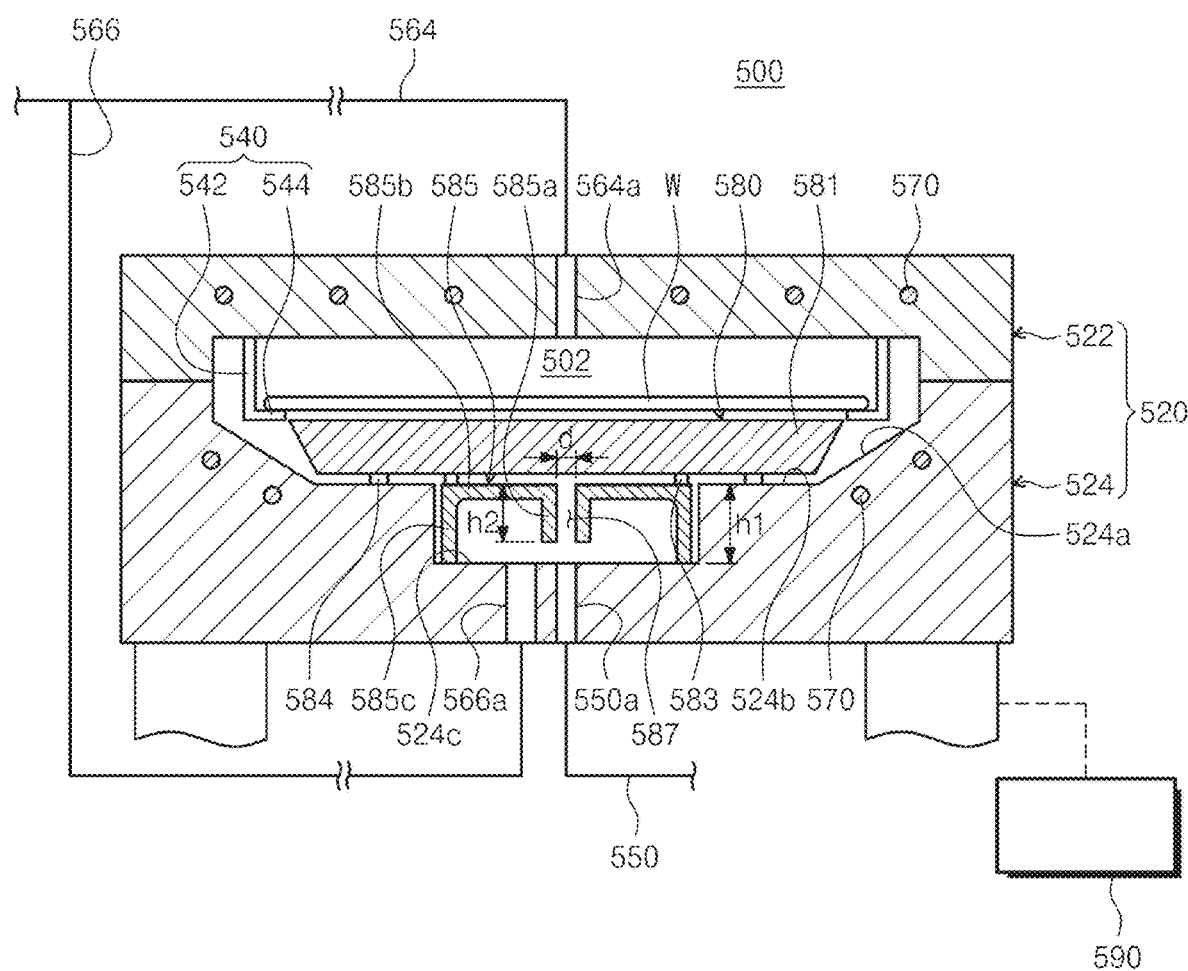
FIG. 3 is a schematic view illustrating a first embodiment of a supercritical processing apparatus provided in the substrate treating system according to the embodiment of the inventive concept.

FIG. 3 is a schematic view illustrating one embodiment of the supercritical processing apparatuses 500 of FIG. 1. The supercritical processing apparatus 500 treats a substrate W subjected to liquid treatment with a supercritical fluid. According to an embodiment, the supercritical processing apparatus 500 dries the substrate W using the supercritical fluid. Carbon dioxide ($CO_2$) in a supercritical state may be used as the supercritical fluid. Carbon dioxide behaves as a supercritical fluid at or above 30° C. and 7.4 MPa. Hereinafter, it will be exemplified that supercritical carbon dioxide is used as a process fluid.

According to an embodiment, the supercritical processing apparatus 500 removes a liquid on the substrate W using the supercritical fluid. The supercritical processing apparatus 500 includes a vessel 520, a support member 540, a fluid supply unit 560, and a filler member 580.

The vessel 520 provides a process space 502 in which a supercritical process is performed. The vessel 520 is formed of a material capable of withstanding the critical temperature and the critical pressure of the supercritical fluid. The vessel 520 includes an upper vessel 522 and a lower vessel 524.

The upper vessel 522 has a space formed therein that is open at the bottom. An upper wall of the upper vessel 522 serves as an upper wall of the vessel 520. A sidewall of the upper vessel 522 serves as part of a sidewall of the vessel 520. The lower vessel 524 is located under the upper vessel 522. The lower vessel 524 has a space formed therein that is open at the top. The open top of the lower vessel 524 faces the open bottom of the upper vessel 522. A lower wall of the lower vessel 524 serves as a lower wall of the vessel 520. A sidewall of the lower vessel 524 serves as part of the sidewall of the vessel 520. The upper vessel 522 and the lower vessel 524 are combined with each other to form the process space 502.

The upper vessel 522 and the lower vessel 524 may move relative to each other to open or close the process space 502. A drive member 590 moves at least one of the upper vessel 522 or the lower vessel 524 in the up/down direction. The drive member 590 may be implemented with a hydraulic machine. According to an embodiment, the upper vessel 522 may be fixed in position, and the lower vessel 524 may be raised or lowered by the drive member 590 such as a cylinder. When the lower vessel 524 is spaced apart from the upper vessel 522, the process space 502 is opened. At this time, the substrate W is carried into or out of the process space 502. During the supercritical process, the lower vessel 524 is brought into close contact with the upper vessel 522 and seals the process space 502 from the outside.

The supercritical processing apparatus 500 has a heater 570. According to an embodiment, the heater 570 is located inside the wall of the vessel 520. In an embodiment, the heater 570 may be provided inside at least one of the upper vessel 522 or the lower vessel 524 constituting the vessel 520. The heater 570 heats the process space 502 of the vessel 520 to maintain the fluid supplied into the process space 502 of the vessel 520 in a supercritical state. An atmosphere by the supercritical fluid is formed in the process space 502.

The vessel 520 has a recess formed on the bottom thereof. The recess is formed to a predetermined depth. The recess may be formed in a cylindrical shape. Due to the recess, the vessel 520 has bottom surfaces with different heights. More specifically, a recess having a predetermined depth is formed on a first bottom surface 524b of the vessel 520, and a second bottom surface 524c is formed by the recess. The second bottom surface 524c is in a lower position than the first bottom surface 524b.

The inside surface of the vessel 520 has an inclined surface 524a. The inclined surface 524a connects the first bottom surface 524b and the side surface of the vessel 520. The inclined surface 524a extends from the first bottom surface 524b of the vessel 520 and is upwardly inclined to have a gradually increasing height toward the side surface of the vessel 520. The inclined surface 524a may have an inclination of 10° to 45°.

The support member 540 supports the substrate W in the process space 502 of the vessel 520. The support member 540 includes fixed rods 542 and support parts 544. The fixed rods 542 may be fixedly installed on the upper vessel 522 to protrude downward from the bottom surface of the upper vessel 522. The fixed rods 542 may be provided such that the lengthwise direction thereof is parallel to the up/down direction. The fixed rods 542 may be spaced apart from each other. The fixed rods 542 are disposed such that the substrate W does not interfere with the fixed rods 542 when being carried into or out of the space surrounded by the fixed rods 542. The support parts 544 are coupled to lower ends of the fixed rods 542, respectively. The support parts 544 extend from the lower ends of the fixed rods 542 in directions parallel to the ground. In an embodiment, the support parts 544 extend in a shape capable of supporting the lower edge of the substrate W.

A first supply port 566a and a second supply port 564a supply the supercritical fluid into the vessel 520.

The first supply port 566a is provided in the central area of the bottom surface of the vessel 520. In an embodiment, the first supply port 566a is provided at a position biased from the center of the bottom surface of the vessel 520 by a predetermined distance. In an embodiment, the center of the bottom surface of the vessel 520 may vertically correspond to the center of the substrate W supported on the support member 540. In an embodiment, an outlet of the first supply port 566a is located in the area where the recess of the vessel 520 is formed. In an embodiment, the outlet of the first supply port 566a is formed through the second bottom surface 524c in the up/down direction. The first supply port 566a supplies the supercritical fluid into the space below the substrate W in the process space 502 of the vessel 520.

The second supply port 564a is provided in the central area of the upper wall of the vessel 520. The second supply port 564a supplies the supercritical fluid into the space above the substrate W in the process space 502 of the vessel 520. The supercritical fluid supplied through the second supply port 564a is dispensed onto the upper surface of the substrate W.

The exhaust port 550a releases the fluid remaining in the vessel 520 to the outside. The exhaust port 550a is provided inside the lower wall of the vessel 520. The exhaust port 550a may be located adjacent to the first supply port 566a. The exhaust port 550a is provided in the central area of the bottom surface of the vessel 520. In an embodiment, the exhaust port 550a is provided at the center of the bottom surface of the vessel 520. An inlet of the exhaust port 550a is provided in the area where the recess of the vessel 520 is formed. In an embodiment, the inlet of the exhaust port 550a is proved at the center of the second bottom surface 524c. In an embodiment, the inlet of the exhaust port 550a is formed through the second bottom surface 524c in the up/down direction. In an embodiment, the exhaust port 550a has a smaller diameter than the first supply port 566a. The fluid released through the exhaust port 550a includes the supercritical fluid in which an organic solvent is dissolved. The fluid released through the exhaust port 550a may be delivered to a regeneration apparatus (not illustrated). In the regeneration apparatus, the fluid may be divided into the supercritical fluid and the organic solvent. Alternatively, the fluid released through the exhaust port 550a may be discharged into the atmosphere through an exhaust line 550.

The fluid supply unit 560 supplies the process fluid into the process space 502 of the vessel 520. According to an embodiment, the process fluid may be supplied in a supercritical state into the process space 502. Alternatively, the process fluid may be supplied in a gaseous state into the process space 502 and may experience a phase change into a supercritical state in the process space 502. According to an embodiment, the fluid supply unit 560 may have a main supply line 562, an upper branch line 564, and a lower branch line 566. The upper branch line 564 and the lower branch line 566 branch off from the main supply line 562. The upper branch line 564 is coupled to the second supply port 564a and supplies the process fluid from above the substrate W placed on the support member 540. The lower branch line 566 is coupled to the first supply port 566a and supplies the process fluid from below the substrate W placed on the support member 540. The exhaust line 550 is coupled to the exhaust port 550a. The supercritical fluid in the process space 502 of the vessel 520 is released outside the vessel 520 through the exhaust unit 550.

Figure 4:
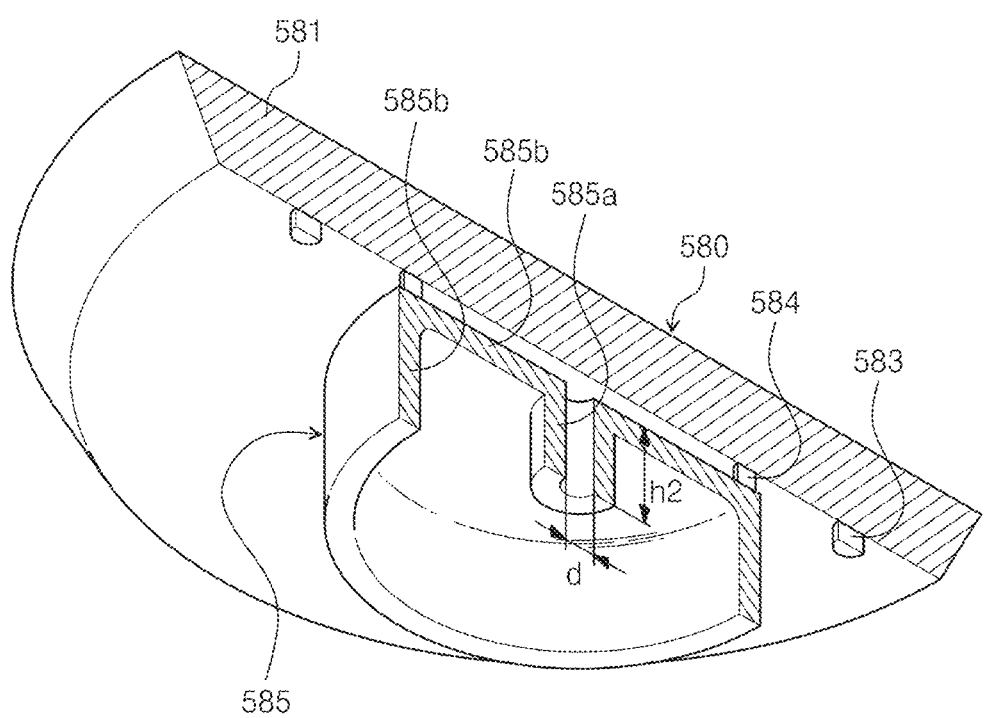
FIG. 4 is a perspective view illustrating a first embodiment of a filler member provided in the supercritical processing apparatus according to the first embodiment.

The filler member 580 is located under the support member 540. The filler member 580 includes a plate member 581 and a buffer member 585. FIG. 4 is a perspective view illustrating a first embodiment of the filler member provided in the supercritical processing apparatus according to the first embodiment. The filler member 580 will be described below with reference to FIGS. 3 and 4.

The plate member 581 has a plate shape with a predetermined thickness. The plate member 581 may have a solid or hollow form. The plate member 581 has an upper surface, a lower surface, and a side surface. The upper surface and the lower surface face each other and are disposed parallel to each other. The upper surface has a larger area than the lower surface. A preset gap may be maintained between the upper surface of the plate member 581 and the lower surface of the substrate W, with the inside of the vessel 520 sealed from the outside. For example, a gap of 0.2 cm to 1.0 cm may be maintained between the upper surface of the plate member 581 and the lower surface of the substrate W. The lower surface is disposed to face the first bottom surface 524b of the vessel 520. The lower surface is spaced apart from the first bottom surface 524b of the vessel 520 by a predetermined gap. According to an embodiment, the lower surface of the plate member 581 may be spaced apart from the first bottom surface 524b of the vessel 520 by a gap of 0.1 cm to 2 cm. The side surface of the plate member 581 connects the upper surface and the lower surface of the plate member 581. The side surface of the plate member 581 extends from the lower surface and is formed to be upwardly inclined such that the plate member 581 has a gradually increasing cross-sectional area toward the top. The side surface of the plate member 581 may be provided side by side with the inclined surface 524a. The side surface of the plate member 581 may be provided such that a partial area thereof faces the inclined surface 524a. The side surface of the plate member 581 is spaced apart from the inclined surface 524a by a predetermined gap. According to an embodiment, the side surface of the plate member 581 may be spaced apart from the inclined surface 524a by a gap of 0.1 cm to 2 cm.

The space between the lower surface of the plate member 581 and the first bottom surface 524b of the vessel 520 and the space between the side surface of the plate member 581 and the inclined surface 524a of the vessel 520 are connected with each other and provide a path along which the supercritical fluid supplied through the first supply port 566a moves.

First support rods 584 support the lower surface of the plate member 581. The first support rods 584 are spaced apart from each other. Upper ends of the first support rods 584 are coupled with the plate member 581, and lower ends of the first support rods 584 are placed on the first bottom surface 524b of the vessel 520.

The buffer member 585 is provided under the plate member 581. The upper surface of the buffer member 585 and the lower surface of the plate member 581 are spaced apart from each other by a predetermined gap. The separation gap between the upper surface of the buffer member 585 and the lower surface of the plate member 581 is equal or similar to the separation gap between the lower surface of the plate member 581 and the first bottom surface 524b of the vessel 520. According to an embodiment, the upper surface of the buffer member 585 and the lower surface of the plate member 581 may be spaced apart from each other by a gap of 0.1 cm to 2 cm. The upper surface of the buffer member 585 and the lower surface of the plate member 581 may be spaced apart from each other by second support rods 583. The second support rods 583 are spaced apart from each other. Upper ends of the second support rods 583 are coupled with the plate member 581, and lower ends of the second support rods 583 are placed on the upper surface of the buffer member 585.

The buffer member 585 according to the embodiment is located in the recess formed on the first bottom surface 524b of the vessel 520. The buffer member 585 includes a sidewall portion 585c and an upper wall portion 585b. The sidewall portion 585c is supported on the second bottom surface 524c. The sidewall portion 585c is located outward of the first supply port 566a and the exhaust port 550a. The inner diameter of the sidewall portion 585c is greater than the distance between the first supply port 566a and the exhaust port 550a such that the first supply port 566a and the exhaust port 550a are located inward of the sidewall portion 585c. The sidewall portion 585c makes contact with the second bottom surface 524c and prevents the supercritical fluid supplied through the first supply port 566a from passing beneath the sidewall portion 585c. The lower surface of the sidewall portion 585c is preferably completely brought into close contact with the second bottom surface 524c.

The upper surface of the upper wall portion 585b is located at the same height as, or a height similar to, the height of the plane formed by the first bottom surface 524b of the vessel 520. When viewed from above, the upper wall portion 585b overlaps the first supply port 566a. A through-hole 587 is formed at the center of the upper wall portion 585b. The through-hole 587 is provided at the position corresponding to the center of the substrate W supported on the support member 540. Furthermore, the through-hole 587 is provided at the position corresponding to the center of the plate member 581. The through-hole 587 is formed to be perpendicular to the upper wall portion 585b in the up/down direction. In this embodiment, the buffer member 585 further includes an inner wall portion 585a. The inner wall portion 585a vertically extends from the upper wall portion 585b along the lengthwise direction of the through-hole 587 and surrounds the through-hole 587. The extension length h2 of the inner wall portion 585a is shorter than the total height of the buffer member 585. When the length of the through-hole 587 is extended such that the extension length h2 of the inner wall portion 585a is greater than or equal to 30% of the height h1 of the buffer member 585, the supercritical fluid that is supplied through the first supply port 566a biased from the center and is not uniformly supplied to the substrate W may be controlled to flow in the vertical direction with respect to the center of the substrate W. Meanwhile, the inventors recognize that the through-hole 587 having a small diameter rather than a large diameter is effective in controlling the supercritical fluid to flow in the vertical direction with respect to the center of the substrate W. It is preferable to appropriately design the diameter d of the through-hole 587 to a degree that a phase change depending on a moving path of the supercritical fluid does not occur. Furthermore, in an embodiment, to facilitate an exhaust flow, the diameter d of the through-hole 587 may be greater than or equal to the diameter of the exhaust port 550a.

The through-hole 587 and the exhaust port 550a may be located on a straight line. This helps to uniformly form an exhaust flow over the entire area of the substrate W when the atmosphere in the process space 502 is evacuated. Furthermore, the filler member 580 may prevent the supercritical fluid supplied through the first supply port 566a from being directly dispensed onto the lower surface of the substrate W. In addition, the volume of the process space 502 may be decreased by the filler member 580. Accordingly, the filler member 580 may reduce the amount of supercritical fluid used in a drying process and process time while maintaining process performance.

Figure 5:
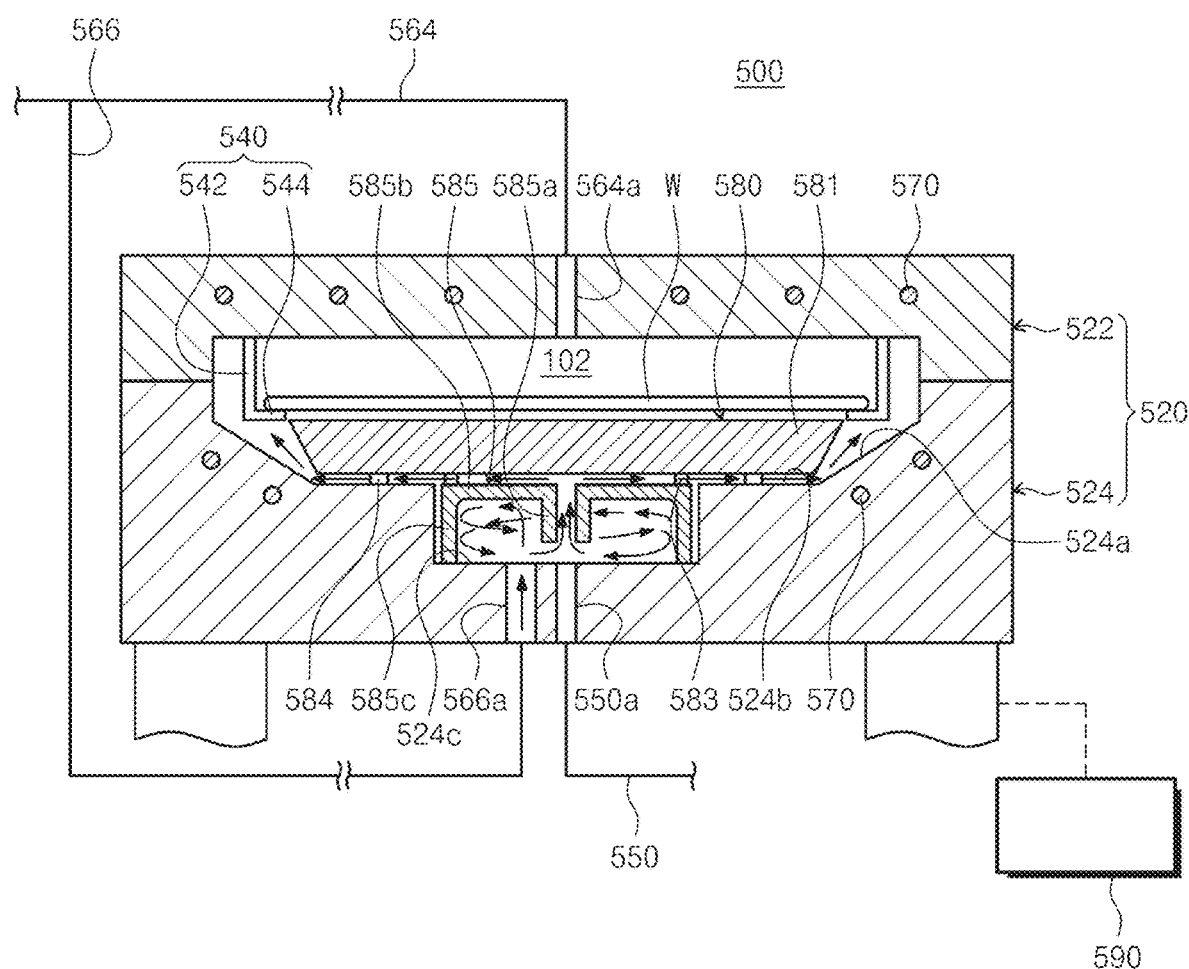
FIG. 5 illustrates a flow of a process fluid when the process fluid is supplied into the supercritical processing apparatus according to the first embodiment.

In this embodiment, a buffer space is defined by the sidewall portion 585c, the upper wall portion 585b, and the inner wall portion 585a of the buffer member 585 and the second bottom surface 524c. FIG. 5 illustrates a flow of a process fluid when the process fluid is supplied into the supercritical processing apparatus according to the first embodiment. The buffer space of the filler member 580 according to the first embodiment will be described below with reference to FIGS. 3 and 5.

When the supercritical fluid is introduced into the vessel 520 through the first supply port 566a, the inertia depending on the supply direction in the buffer space is cancelled out, and the flow speed is reduced. A vortex of the supercritical fluid may be formed in the buffer space. The kinetic energy of the supercritical fluid supplied through the first supply port 566a may be reduced in the buffer space, and the supercritical fluid having reduced kinetic energy is supplied through the through-hole 587. Accordingly, a flow of the supercritical fluid generated around the substrate W may be uniformly controlled, and thus the temperature of the substrate W may be controlled.

Figure 6:
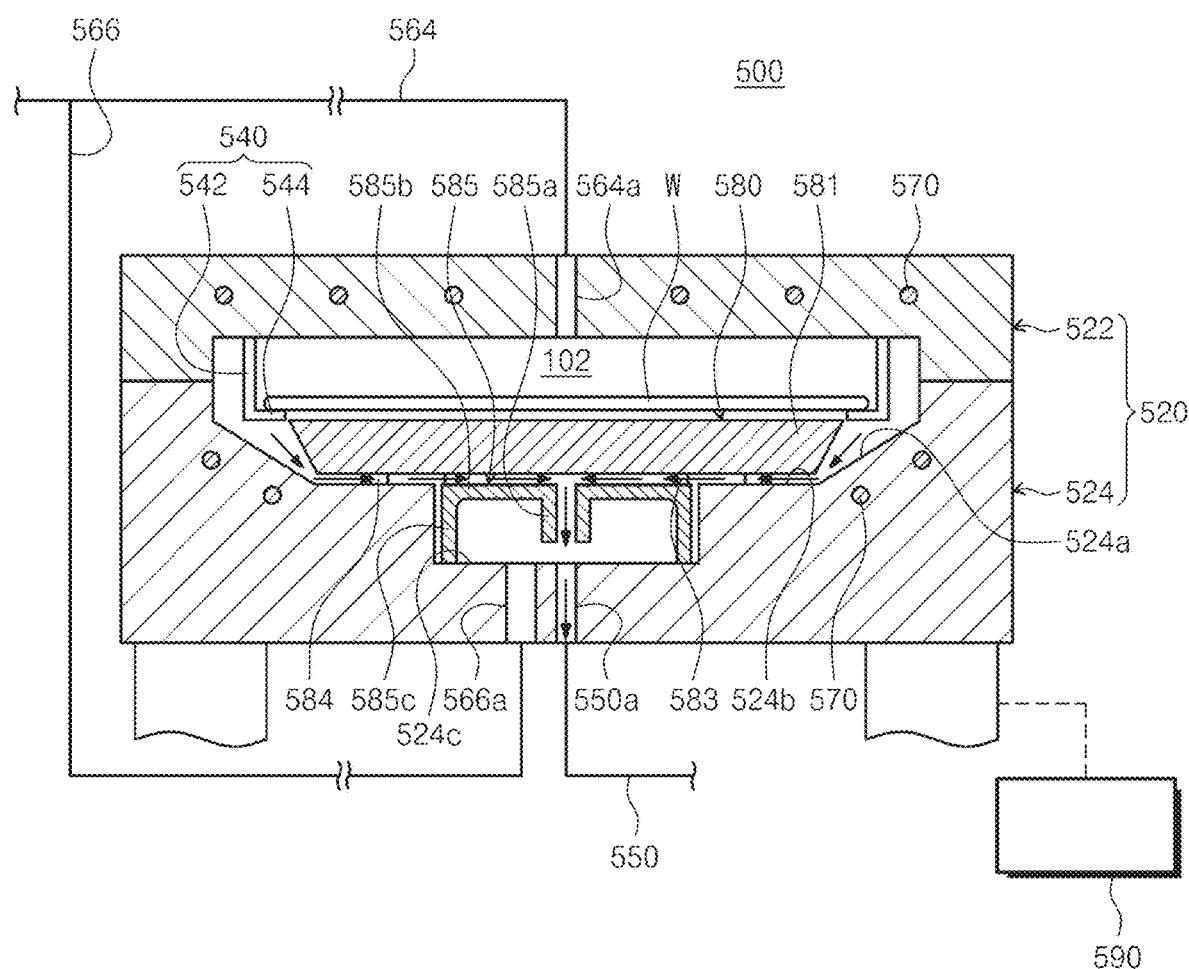
FIG. 6 illustrates a flow of a process fluid when the process fluid is released from the supercritical processing apparatus according to the first embodiment.

FIG. 6 illustrates a flow of a process fluid when the process fluid is released from the supercritical processing apparatus according to the first embodiment. An exhaust flow according to an embodiment of the inventive concept will be described below with reference to FIGS. 3 and 6.

The supercritical fluid supplied into the process space 502 of the vessel 520 and used to treat the substrate W and the solvent dissolved in the supercritical fluid are discharged outside the vessel 520 through the exhaust port 550a. The fluid is discharged outside the vessel 520 along the exhaust line 550 connected with the exhaust port 550a. The fluid flow may be uniformly formed over the entire area of the substrate W because the through-hole 587 and the exhaust port 550a are located on a straight line.

Figure 7:
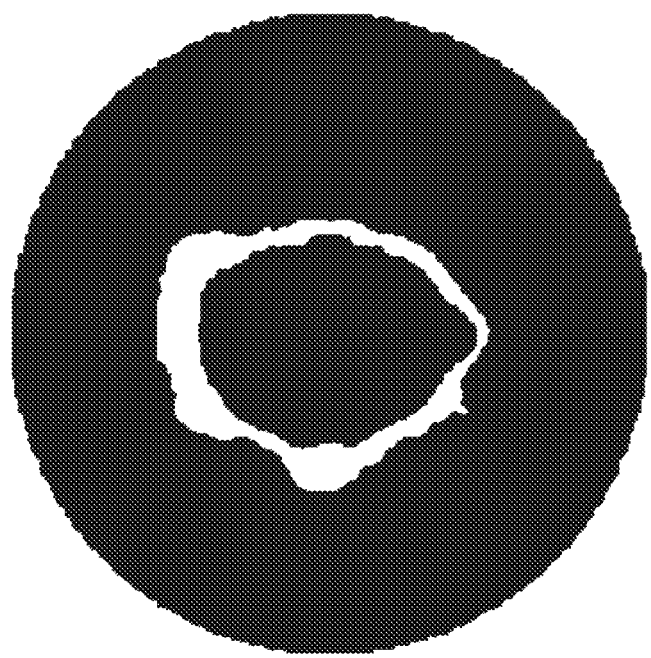
FIG. 7 is a simulation result of temperature distribution of a substrate treated by the supercritical processing apparatus according to the first embodiment.

FIG. 7 is a simulation result of temperature distribution of a substrate treated by the supercritical processing apparatus according to the first embodiment of the inventive concept. In this simulation result, the red portion has the highest temperature. As illustrated in FIG. 7, when the substrate is treated by the supercritical processing apparatus according to the embodiment of the inventive concept, the temperature of the central area of the substrate is uniform, and the temperature of the edge area of the substrate is uniform. That is, it can be seen that the temperature distribution for each area is uniform.

Figure 8:
FIG. 8 is a simulation result of temperature distribution of a substrate according to a comparative example.

FIG. 8 is a simulation result of temperature distribution of a substrate according to a comparative example. In this simulation result, the red portion has the highest temperature. In the comparative example, it can be seen that when the inertia depending on a flow of a supercritical fluid is not cancelled out unlike in the embodiment of the inventive concept, the temperature distribution for each area is not uniform due to the flow of the supercritical fluid.

Figure 9:
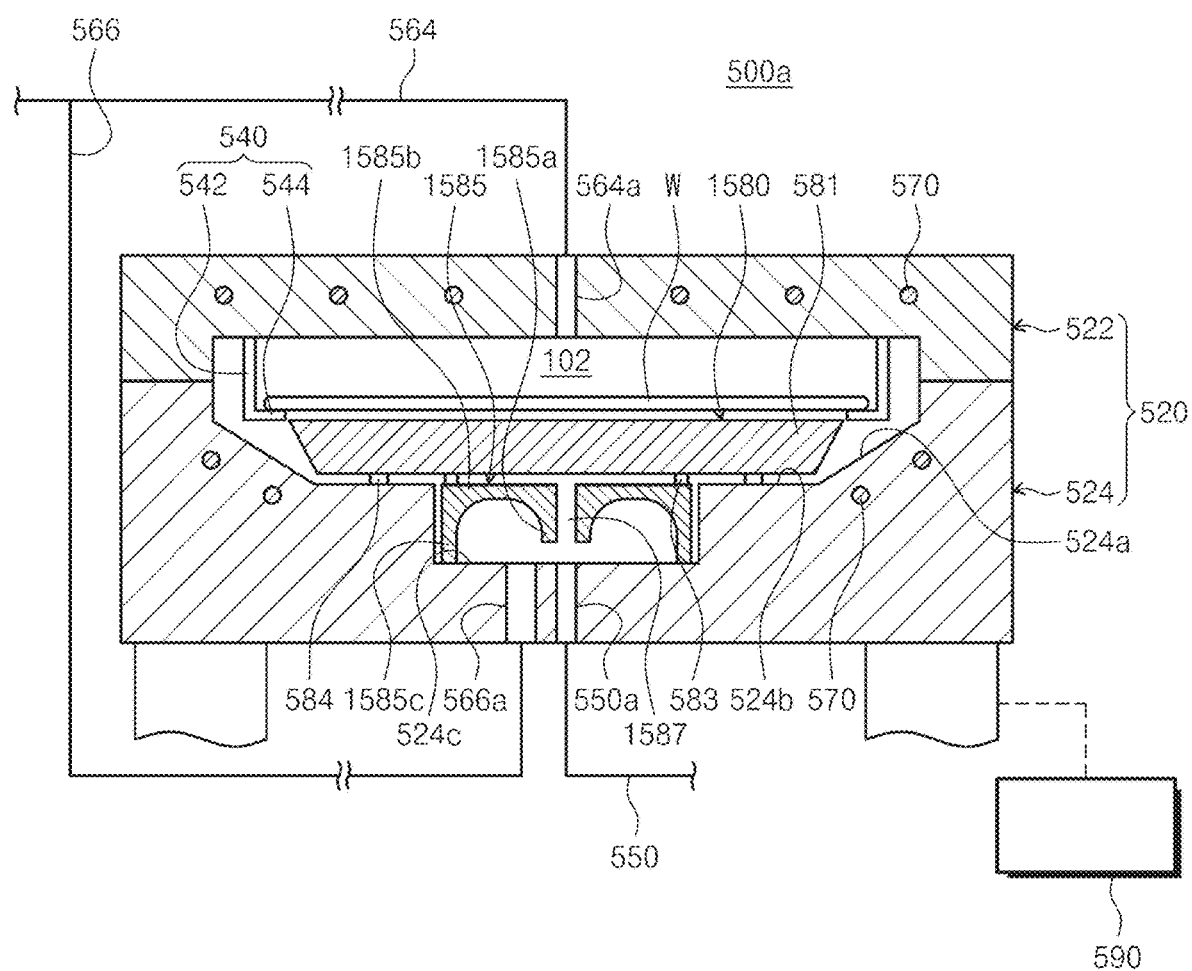
FIG. 9 illustrates a supercritical processing apparatus including a filler member according to a second embodiment of the inventive concept.

FIG. 9 illustrates a supercritical processing apparatus including a filler member according to a second embodiment of the inventive concept. The filler member 1580 according to the second embodiment will be described below with reference to FIG. 9. Descriptions of components of the filler member 1580 that are identical to the components of the filler member 580 according to the first embodiment will be omitted.

A buffer member 1585 according to an embodiment is located in a recess formed on a first bottom surface 524b of a vessel 520. The buffer member 1585 includes a sidewall portion 1585c, an upper wall portion 1585b, and an inner wall portion 1585a. The sidewall portion 1585c is supported on a second bottom surface 524c. The sidewall portion 1585c is located outward of a first supply port 566a and an exhaust port 550a. The inner diameter of the sidewall portion 1585c is greater than the distance between the first supply port 566a and the exhaust port 550a such that the first supply port 566a and the exhaust port 550a are located inward of the sidewall portion 1585c. The sidewall portion 1585c makes contact with the second bottom surface 524c and prevents a supercritical fluid supplied through the first supply port 566a from passing beneath the sidewall portion 1585c. The lower surface of the sidewall portion 1585c is preferably completely brought into close contact with the second bottom surface 524c. At least one of a connecting portion between the sidewall portion 1585c and the upper wall portion 1585b or a connecting portion between the upper wall portion 1585b and the inner wall portion 1585a may be formed to be curved. In an embodiment of the inventive concept, the inside of the connecting portion between the sidewall portion 1585c and the upper wall portion 1585b is formed to be curved. Furthermore, the inside of the connecting portion between the upper wall portion 1585b and the inner wall portion 1585a is formed to be curved. As the walls forming the buffer space are formed to be curved, the supercritical fluid may be controlled to flow through a through-hole 1587, by reducing the kinetic energy of the supercritical fluid and controlling a flow direction of the supercritical fluid.

Figure 10:
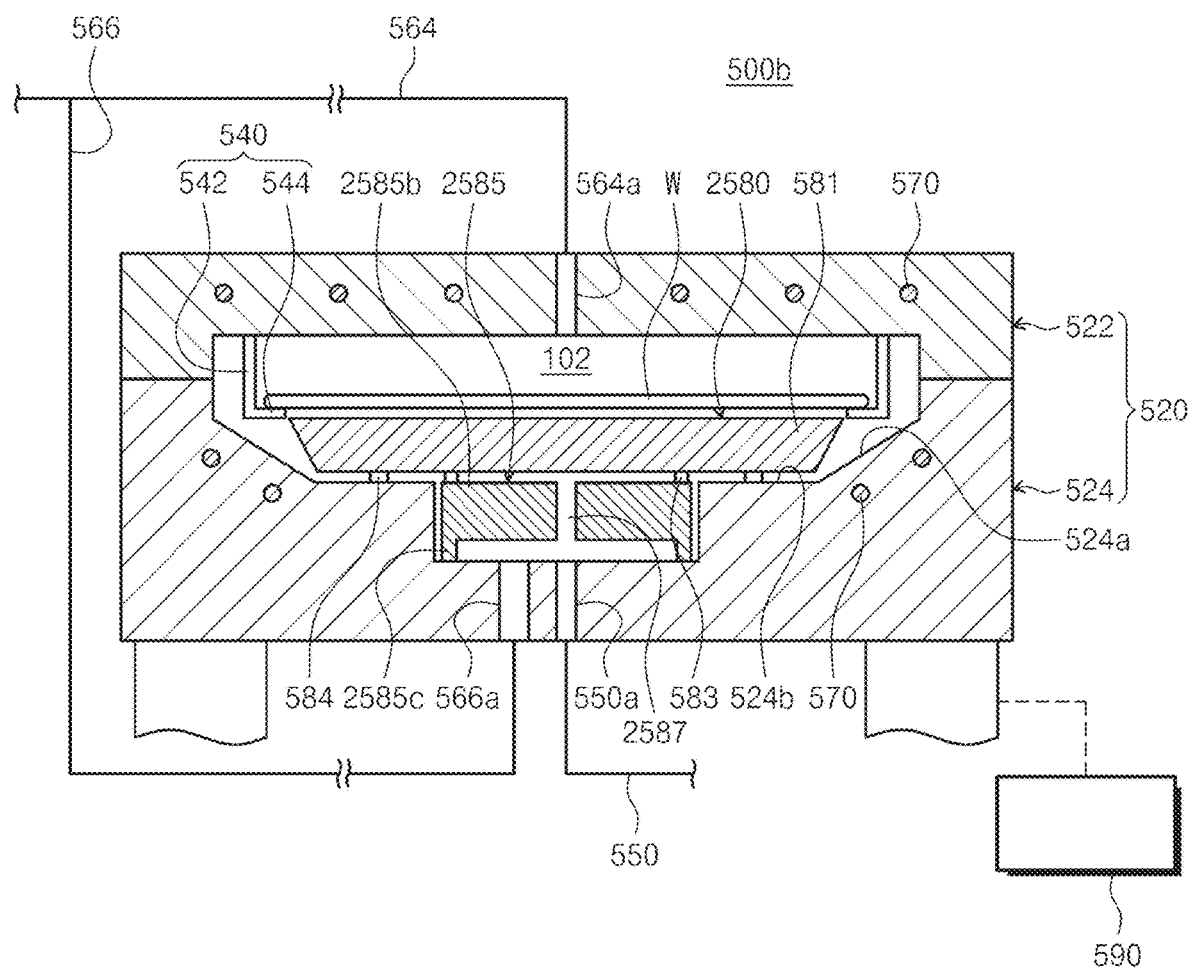
FIG. 10 illustrates a supercritical processing apparatus including a filler member according to a third embodiment of the inventive concept.

FIG. 10 illustrates a supercritical processing apparatus including a filler member according to a third embodiment of the inventive concept. The filler member 2580 according to the third embodiment will be described below with reference to FIG. 10. Descriptions of components of the filler member 2580 that are identical to the components of the filler member 580 according to the first embodiment will be omitted.

A buffer member 2585 according to an embodiment is located in a recess formed on a first bottom surface 524b of a vessel 520. The buffer member 2585 includes a sidewall portion 2585c and an upper wall portion 2585b. The sidewall portion 2585c is supported on a second bottom surface 524c. The sidewall portion 2585c is located outward of a first supply port 566a and an exhaust port 550a. The inner diameter of the sidewall portion 2585c is greater than the distance between the first supply port 566a and the exhaust port 550a such that the first supply port 566a and the exhaust port 550a are located inward of the sidewall portion 2585c. The sidewall portion 2585c makes contact with the second bottom surface 524c and prevents a supercritical fluid supplied through the first supply port 566a from passing beneath the sidewall portion 2585c. The lower surface of the sidewall portion 2585c is preferably completely brought into close contact with the second bottom surface 524c.

The upper surface of the upper wall portion 2585b is located at the same height as, or a height similar to, the height of the plane formed by the first bottom surface 524b of the vessel 520. When viewed from above, the upper wall portion 2585b overlaps the first supply port 566a. A through-hole 2587 is formed at the center of the upper wall portion 2585b. The through-hole 2587 is formed to be perpendicular to the upper wall portion 2585b in the up/down direction. The upper wall portion 2585b has a thickness such that the through-hole 2587 has an appropriate flow length. The thickness of the upper wall portion 2585b is not greater than the total height of the buffer member 2585. The upper wall portion 2585b and the second bottom surface 524c are spaced apart from each other by a predetermined gap. The length of the through-hole 2587 by the thickness of the upper wall portion 2585b is greater than or equal to 30% of the height of the buffer member 2585. When the length of the through-hole 2587 is extended, the supercritical fluid that is supplied through the first supply port 566a biased from the center and is not uniformly supplied to a substrate W may be controlled to flow in the vertical direction with respect to the center of the substrate W. Meanwhile, the inventors recognize that the through-hole 2587 having a small diameter rather than a large diameter is effective in controlling the supercritical fluid to flow in the vertical direction with respect to the center of the substrate W. It is preferable to appropriately design the diameter of the through-hole 2587 to a degree that a phase change depending on a moving path of the supercritical fluid does not occur.

Figure 11:
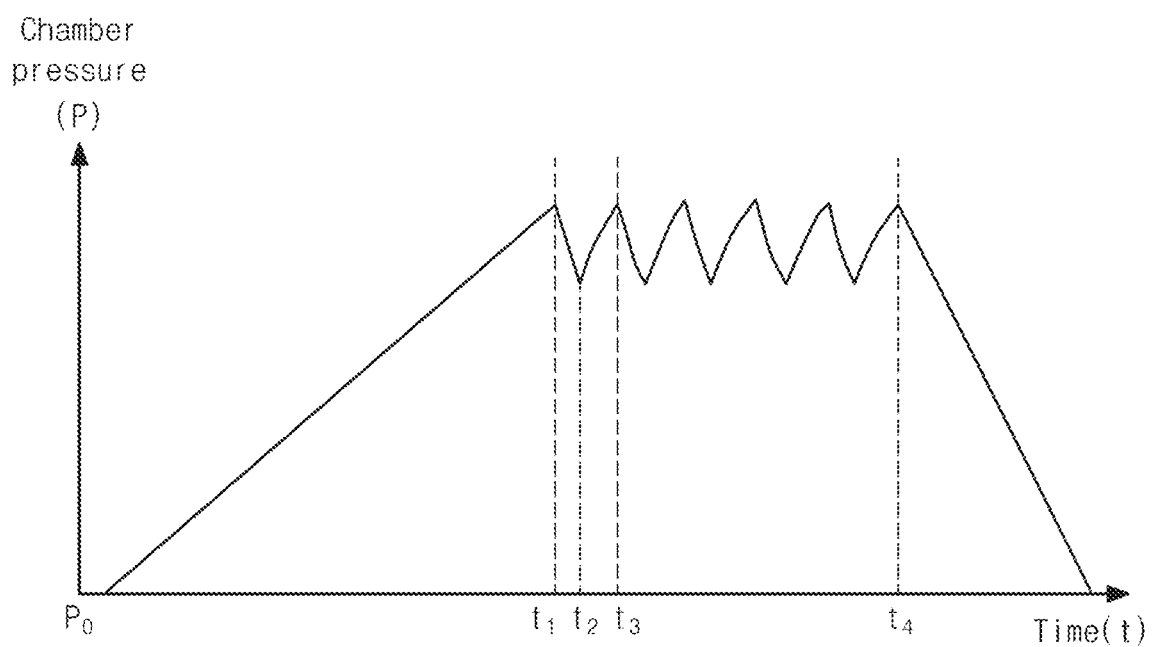
FIG. 11 is a graph depicting a pressure change in a process space over time depending on supply and release of a process fluid according to an embodiment of the inventive concept.

FIG. 11 is a graph depicting a pressure change in a process space over time depending on supply and release of a process fluid according to an embodiment of the inventive concept. In the graph of pressure versus time in FIG. 11, a rising portion corresponds to a process in which the process fluid is supplied into the process space 502, and a falling portion corresponds to a process in which the process fluid is released from the process space 502. The pressure in the process space 502 is raised above the critical pressure of the process fluid by supplying the process fluid into the process space 502 until time t1, and treatment efficiency is improved by repeatedly performing a supply step and a release step from time t1 to time t4. When the substrate is completely treated, the pressure in the process space 502 is lowered to the atmospheric pressure $P_0$ by evacuating the atmosphere in the process space 502. According to the embodiment of the inventive concept, a temperature deviation occurring in the process of supplying and releasing the supercritical fluid may be reduced, and temperature distribution for each area of the substrate may be uniform.

Quantitative values of effects obtained by the filler member 580 according to the first embodiment, the filler member 1580 according to the second embodiment, and the filler member 2580 according to the third embodiment may differ from one another. However, according to the embodiments of the inventive concept, temperature distribution for each area of a substrate may be made uniform by reducing the kinetic energy of a supercritical fluid and vertically supplying the supercritical fluid in the central area of the substrate.

As described above, according to the embodiments of the inventive concept, the substrate treating apparatuses may efficiently treat a substrate.

According to the embodiments of the inventive concept, the substrate treating apparatuses may make temperature distribution for each area of a substrate uniform even by a flow of a process fluid supplied into a process space.

According to the embodiments of the inventive concept, the substrate treating apparatuses may achieve a uniform flow of a process fluid supplied into a process space and directed toward a substrate.

Effects of the inventive concept are not limited to the above-described effects, and any other effects not mentioned herein may be clearly understood from this specification and the accompanying drawings by those skilled in the art to which the inventive concept pertains The above description exemplifies the inventive concept. Furthermore, the above-mentioned contents describe various embodiments for implementing the technical spirit of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. Accordingly, the detailed description of the inventive concept is not intended to restrict the inventive concept in the disclosed embodiment state. In addition, it should be construed that the attached claims include other embodiments. These modifications and variations should not be understood separately from the technical ideas or prospects of the inventive concept.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a vessel having a sealable process space formed therein in which the substrate is accommodated;
    a supply port provided inside a wall of the vessel and configured to supply a process fluid into the process space;
    an exhaust port provided inside the wall of the vessel and spaced apart from the supply port; and
    a buffer member provided in the process space, the buffer member being provided in a position overlapping with the supply port and the exhaust port when viewed from above,
    wherein the buffer member includes:
    a sidewall portion located outward of the supply port and the exhaust port and configured to make contact with the wall of the vessel; and
    an upper wall portion having a through-hole formed therein to correspond to a center of the substrate, wherein the through-hole forms a straight flow path in an up/down direction.

2. The apparatus of claim 1, wherein the through-hole is aligned with the exhaust port.

3. The apparatus of claim 1, wherein the supply port, when viewed from above, is provided at a position where the through-hole of the upper wall portion is not formed.

4. The apparatus of claim 1, wherein the flow path formed by the through-hole has a length greater than or equal to 30% of a total height of the buffer member and less than the total height of the buffer member.

5. The apparatus of claim 1, wherein the buffer member further includes an inner wall portion extending downward from the upper wall portion to increase a length of the flow path of the through-hole, and
    wherein a buffer space is formed by the sidewall portion, the upper wall portion, and the inner wall portion.

6. The apparatus of claim 1, further comprising:
    a plate member located over the buffer member and provided in a position overlapping the through-hole when viewed from above, the plate member being spaced apart from the buffer member.

7. The apparatus of claim 6, wherein the plate member includes an upper surface, a lower surface, and a side surface,
    wherein the upper surface has a larger area than the lower surface and is disposed side by side with the lower surface to face the lower surface, and
    wherein the side surface connects the upper surface and the lower surface and is formed to be upwardly inclined toward the top.

8. The apparatus of claim 1, wherein a first bottom surface configured to define the process space is formed in the vessel,
    wherein a recess is formed to a predetermined depth on the first bottom surface, and a second bottom surface is formed by the recess, and
    wherein the supply port and the exhaust port are provided in an area of the second bottom surface.

9. The apparatus of claim 8, wherein the buffer member is placed on the second bottom surface, and
    wherein an upper surface of the buffer member placed on the second bottom surface is in a position parallel to the first bottom surface.

10. The apparatus of claim 1, wherein the buffer member has a circular shape when viewed from above.

11. The apparatus of claim 1, wherein the process fluid is heated to a temperature higher than room temperature and is supplied into the process space.

12. The apparatus of claim 1, wherein the process fluid is a supercritical fluid.

13. A filler member for filling part of a volume of a process space in a substrate treating apparatus including a vessel configured to provide the sealed process space, a supply port configured to supply a process fluid into the process space, and an exhaust port configured to evacuate an atmosphere in the process space, the filler member comprising:
- a plate member disposed under a substrate, the plate member having a predetermined thickness; and
- a buffer member provided under the plate member and spaced apart from the plate member,
- wherein the buffer member includes:
- a sidewall portion located outward of the supply port and the exhaust port and configured to make contact with a wall of the vessel; and
- an upper wall portion having a through-hole formed therein to correspond to a center of the plate member, wherein the through-hole forms a straight flow path in an up/down direction.

14. The filler member of claim 13, wherein the through-hole is aligned with the exhaust port.

15. The filler member of claim 13, wherein when viewed from above, the through-hole of the upper wall portion is provided at a position not overlapping the supply port.

16. The filler member of claim 13, wherein the flow path formed by the through-hole has a length greater than or equal to 30% of a total height of the buffer member and less than the total height of the buffer member.

17. The filler member of claim 13, wherein the buffer member further includes an inner wall portion extending downward from the upper wall portion to increase a length of the flow path of the through-hole, and
wherein a buffer space is formed by the sidewall portion, the upper wall portion, and the inner wall portion.

18. The filler member of claim 13, wherein the plate member includes an upper surface, a lower surface, and a side surface,
wherein the upper surface has a larger area than the lower surface and is disposed side by side with the lower surface to face the lower surface, and
wherein the side surface connects the upper surface and the lower surface and is formed to be upwardly inclined toward the top.

19. The filler member of claim 13, wherein the buffer member has a circular shape when viewed from above, and
wherein the plate member has a circular shape when viewed from above.

20. An apparatus for treating a substrate, the apparatus comprising:
- a vessel having a sealable process space formed therein in which the substrate is accommodated;
- a supply port provided inside a wall of the vessel and configured to supply a process fluid into the process space;
- an exhaust port provided inside the wall of the vessel and spaced apart from the supply port; and
- a filler member configured to fill part of a volume of the process space,
- wherein a first bottom surface configured to define the process space is formed in the vessel,
- wherein a cylindrical recess is formed to a predetermined depth on the first bottom surface, and a second bottom surface is defined by the recess,
- wherein the supply port and the exhaust port are provided in an area of the second bottom surface,
- wherein the filler member includes:
- a plate member disposed under the substrate, the plate member having a predetermined thickness; and
- a buffer member provided under the plate member and spaced apart from the plate member, the buffer member being provided in a position overlapping with the supply port and the exhaust port when viewed from above, and
- wherein the buffer member includes:
- a sidewall portion placed on the second bottom surface and located outward of the supply port and the exhaust port, the sidewall portion being configured to make contact with the wall of the vessel;
- an upper wall portion having a through-hole formed therein to correspond to a center of the substrate, wherein the through-hole forms a straight flow path in an up/down direction, and an upper surface of the upper wall portion is provided in a position parallel to the first bottom surface; and
- an inner wall portion extending downward from the upper wall portion to increase a length of the flow path of the through-hole.

* * * * *